United States Patent
Honda

[11] Patent Number: 5,461,334
[45] Date of Patent: Oct. 24, 1995

[54] ADDRESS TRANSITION DETECTOR CIRCUIT AND METHOD OF DRIVING SAME

[75] Inventor: Takashi Honda, Tokyo, Japan

[73] Assignee: Oki Electric Industry Co., Ltd., Tokyo, Japan

[21] Appl. No.: 246,283

[22] Filed: May 19, 1994

[30] Foreign Application Priority Data

May 28, 1993 [JP] Japan .................................. 5-127197

[51] Int. Cl.$^6$ ...................... H03K 3/033; H03K 19/0175
[52] U.S. Cl. .................... 327/227; 327/81; 327/82
[58] Field of Search .................. 327/78, 79, 81, 327/82, 227

[56] References Cited

U.S. PATENT DOCUMENTS 4,710,648 12/1987 Hanamura et al. ..................... 307/443
5,376,837 12/1994 Nakano .................................... 327/227

FOREIGN PATENT DOCUMENTS 0105757  4/1984  European Pat. Off. .

Primary Examiner—Margaret Rose Wambach
Attorney, Agent, or Firm—Frishauf, Holtz, Goodman, Langer & Chick

[57] ABSTRACT

An address transition detector circuit according to the present invention comprises an input terminal, a one-shot pulse generator circuit having an input electrically connected to the input terminal, a first switching device electrically connected between a first and second nodes and brought into a conducting state in response to a one-shot pulse output from the one-shot pulse generator circuit, a second switching device electrically connected between a ground potential node and the second node and driven in response to a signal input to the input terminal, a plurality of switching devices parallel-connected between the first and second nodes and respectively driven in response to a plurality of address transition one-shot pulse signals, and power source potential supplying means for supplying a power source potential to the first node. Therefore, the address transition detector circuit can prevent malfunctions from occurring even if a change in the input signal and an address transition take place at the same time.

5 Claims, 2 Drawing Sheets 5,461,334

ADDRESS TRANSITION DETECTOR CIRCUIT AND METHOD OF DRIVING SAME

BACKGROUND OF THE INVENTION

1. Field of the Invention

This invention relates to an address transition detector circuit (hereinafter called an "ATD circuit") and a method of driving the ATD circuit.

2. Description of the Related Art

A conventional ATD circuit is activated in response to a change of a GT signal to be described below in detail from a Low level (hereinafter called an "L level") to a High level (hereinafter called an "H level"). At this time, a signal output from the ATD circuit changes from the L level to the H level. Further, the ATD circuit generates a one-shot pulse (H→L→H level) when a change in a column address is made after the change in the GT signal.

SUMMARY OF THE INVENTION

An ATD circuit according to the present invention comprises:

an input terminal;

a one-shot pulse generator circuit having an input electrically connected to the input terminal;

a first switching device electrically connected between a first and second nodes and brought into a conducting state in response to a one-shot pulse output from the one-shot pulse generator circuit;

a second switching device electrically connected between a ground potential node and the second node and driven in response to a signal input to the input terminal;

a plurality of switching devices electrically parallel-connected between the first and second nodes and respectively driven in response to a plurality of address transition one-shot pulse signals; and power source potential supplying means for supplying a power source potential to the first node.

A method of driving an ATD circuit, according to the present invention comprises the following steps:

a step for bringing a second switching device electrically connected to a ground potential and a second node into a conducting state in response to a change of an input signal from a first potential level to a second potential level;

a step for generating a first one-shot pulse;

a step for bringing a first switching device electrically connected to the second node and a first node into a conducting state in response to the first one-shot pulse and setting the potential at the first node to the ground potential during a period in which the first switching device responds to the first one-shot pulse; and a step for bringing at least one switching device electrically connected between the first and second nodes into a conducting state based on at least one second one-shot pulse responsive to an address transition after the change of the input signal from the first potential level to the second potential level and setting the first node to the ground potential during a period in which at least one switching device responds to the second one-shot pulse.

DETAILED DESCRIPTION OF THE PREFERRED EMBODIMENT

Figure 1:
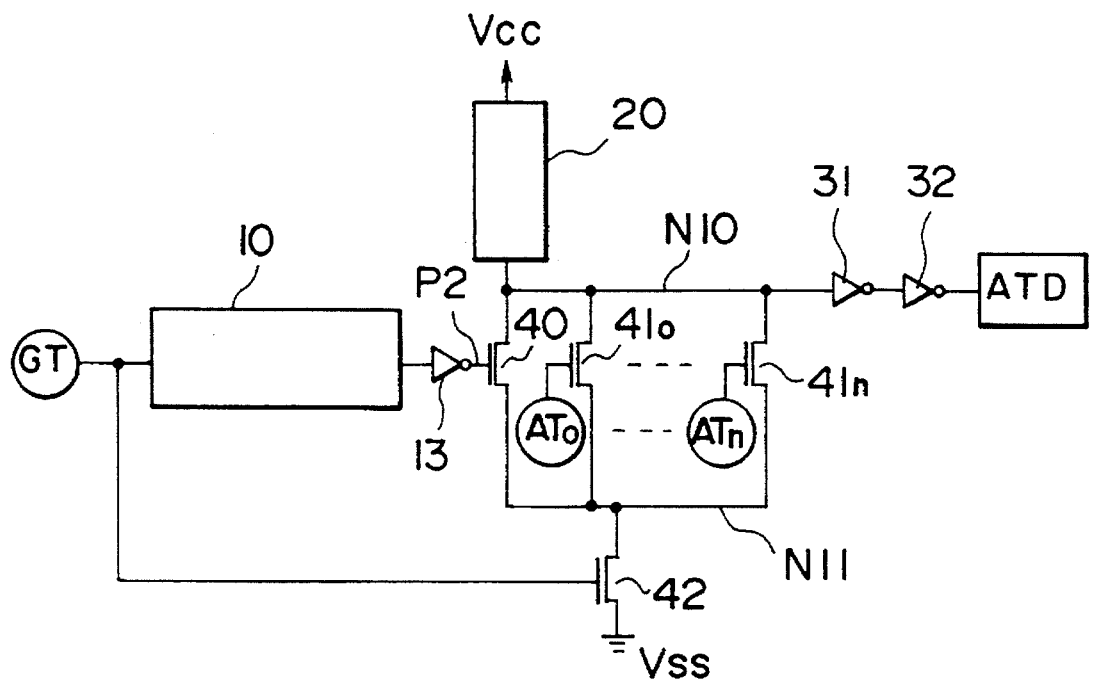
FIG. 1 is a circuit diagram of an ATD circuit showing one embodiment of the present invention.

FIG. 1 is a circuit diagram of an ATD circuit showing one embodiment of the present invention.

A description will now be made of a configuration of the ATD circuit. A GT signal is input to an input of a one-shot pulse generator circuit 10. The GT signal is used to inform a row-selection end operation of the one-shot pulse generator circuit 10 during an operation of selecting a special memory cell from memory cells disposed in matrix (row x column) form. An output of the one-shot pulse generator circuit 10 is electrically connected to an input of an inverter 13. The inverter 13 inverts an output (P1) produced from the one-shot pulse generator circuit 10 so as to generate a one-shot pulse P2.

An output of the inverter 13 is electrically connected to the gate of an N-type metal oxide semiconductor transistor (hereinafter call an "NMOS") 40. The source of the NMOS 40 is electrically connected to a node N11, whereas the drain of the NMOS 40 is electrically connected to a node N10. Further, the respective drains of the NMOSs $41_0$ through $41_n$ are electrically connected to the node N10. The respective sources of the NMOSs $41_0$ through $41_n$ are electrically connected to the node N11. The respective gates of the NMOSs $41_0$ through $41_n$ are supplied with their corresponding one-shot pulses $AT_0$ through $AT_n$. When a certain column address is designated or specified out of column addresses $A_0$ through $A_n$, one of the one-shot pulses $AT_0$ through $AT_n$, which corresponds to the specified column address, is generated. When the column address $A_5$ is specified, for example, the one-shot pulse $AT_5$ is generated. There is a case in which a plurality of column addresses are specified.

The drain of an NMOS 42 is electrically connected to the node N11 and the source thereof is electrically connected to a ground potential VSS. Further, the gate of the NMOS 42 is supplied with the GT signal which has been described above.

The ATD circuit has a means for supplying a power source to change an output signal ATD in this circuit from an initial state to an H level. This means comprises the power source VCC, the node N10 and the load circuit 20 electrically connected between the power source VCC and the node N10. A current is controlled by the load circuit 20. Further, an input of an inverter 31 is electrically connected to the node N10 and an input of an inverter 32 is electrically connected to an output of the inverter 31. An output of the inverter 32 is electrically connected to an output terminal. The inverters 31 and 32 are used to shape the waveform of a signal output to the node N10.

Figure 2:
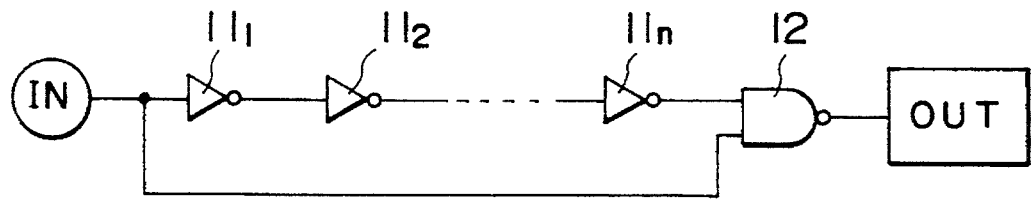
FIG. 2 is a circuit diagram showing one example of a configuration of a one-shot pulse generator circuit 10 shown in FIG. 1.

FIG. 2 is a circuit diagram showing one example of a configuration of the one-shot pulse generator circuit 10 shown in FIG. 1.

The one-shot pulse generator circuit 10 comprises an odd number of inverters $11_1$ through $11_m$ and a two-input NAND gate 12. The odd number of inverters $11_1$ through $11_m$ are electrically series-connected to an input terminal IN and one of input terminals of the two-input NAND gate 12. The other input terminal of the two-input NAND gate 12 is electrically connected to the input terminal IN. An output of the two-input NAND gate 12 is electrically connected to an output terminal OUT.

Figure 3:
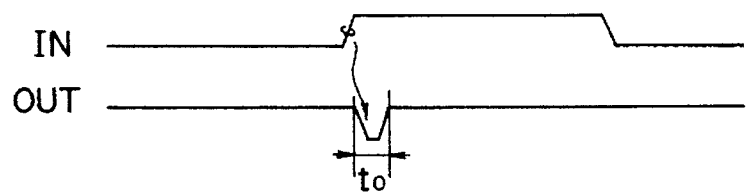
FIG. 3 is a waveform chart for describing the operation of the one-shot pulse generator circuit 10 shown in FIG. 2.

FIG. 3 is a waveform chart for describing the operation of the one-shot pulse generator circuit 10 shown in FIG. 2. When a GT signal input to the input terminal IN is of an L level, the GT signal is first inverted in turn by each of the odd number of inverters $11_1$ through $11_m$. Accordingly, the one input terminal of the two-input NAND gate 12 is supplied with an H level. Further, the other input terminal of the two-input NAND gate 12 is supplied with the L level (GT signal). Therefore, a potential of the H level is output to the output terminal OUT.

A description will now be made of a case where the GT signal changes from the L level to the H level. The one and other terminals of the two-input NAND gate 12 are respectively supplied with the potentials of the L and H levels depending on variations in the GT signal. Since, however, the one terminal of the two-input NAND gate 12 is electrically connected to the input terminal IN through the odd number of inverters $11_1$ through $11_m$, a predetermined time interval $(t_0)$ is taken until the GT signal having the L level is input to the one terminal of the two-input NAND gate 12. Thus, the one terminal of the two-input NAND gate 12 is still supplied with the potential of the H level during the predetermined period $(t_0)$. Therefore, the two input terminals of the two-input NAND gate 12 are respectively supplied with the potentials of the H levels, with the result that an output produced from the two-input NAND gate 12 is brought to the L level. After the elapse of the predetermined period $(t_0)$, the potential of the output produced from the two-input NAND gate 12 is brought to the H level. Thus, the one-shot pulse generator circuit 10 generates a one-shot pulse (H→L→H level) only when the input GT signal changes from the L level to the H level.

Figure 4:
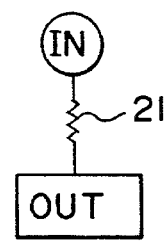
FIG. 4 is a circuit diagram showing one example of a configuration of a load circuit 20 shown in FIG. 1.

FIG. 4 is a circuit diagram illustrating one example of a configuration of the load circuit 20 shown in FIG. 1. A resistor 21 whose resistance value is relatively large is used so as to provide a small current flow in the load circuit 20.

Figure 5:
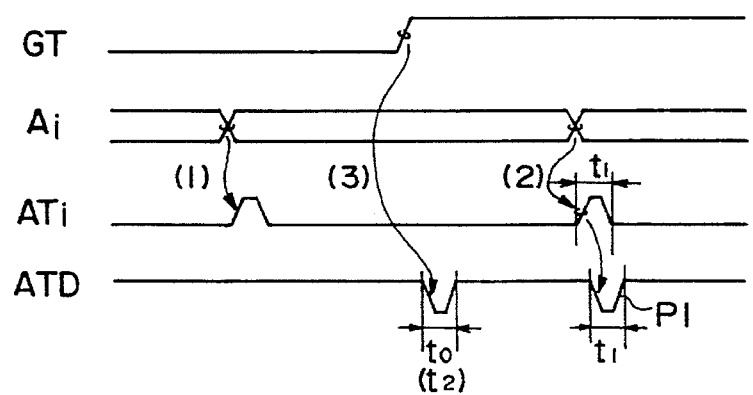
FIG. 5 is a waveform chart for describing the operation of the ATD circuit shown in FIG. 1.

FIG. 5 is a waveform chart for describing the operation of the ATD circuit shown in FIG. 1. The operation of the ATD circuit shown in FIG. 1 will next be described with reference to FIG. 5.

(1) When the GT signal is of the L level, the NMOS 42 is brought into a nonconducting state. Thus, the node N10 is maintained at a potential of an H level irrespective of which column address $A_i(i:0\sim n)$ would be specified or selected from the column addresses $A_0$ through $A_n$, that is, irrespective of a decision made as to which one-shot pulse $AT_i$ of the one-shot pulses $AT_0$ through $AT_n$ would be generated and a decision made as to which NMOS $41_i$ of the NMOSs $41_0$ through $41_n$ would be brought into a conducting state. Accordingly, the output signal ATD is brought to the H level. There is a case where the column address is specified in plural form but, even in this case, the node N10 is maintained at the potential of the H level in the same manner as described above.

(2) When the GT signal is of the H level, the NMOS 42 is brought into the conducting state. When a desired column address $A_i(i:0\sim n)$ is selected from the column addresses $A_0$ through $A_n$ in this condition, the one shot pulse $AT_i$ is generated so that the NMOS $41_i$ is kept in conduction during a predetermined period $(t_1)$. Thus, the node N10 is maintained at a potential of an L level in response to the one-shot pulse $AT_i$ during the predetermined period $(t_1)$. Therefore, a signal having an L level, i.e., a one-shot pulse ATD is output from the output terminal OUT during the predetermined period $(t_1)$.

(3) When the GT signal changes from the L level to the H level, the one-shot pulse generator circuit 10 generates a one-shot pulse P1 as described above. This one-shot pulse P1 is inverted by the inverter 13 so as to be produced as a one-shot pulse P2. At this time, the NMOS 40 is kept in conduction during a predetermined period $(t_2)$ in response to the one-shot pulse P2. Since the NMOS 42 is in a conducting state at this time, the potential at the node N10 is maintained at the L level during the predetermined period $(t_2)$. Thus, a signal having an L level, i.e., a one-shot pulse ATD is generated from the output terminal OUT during the predetermined period $(t_2)$.

Now, consider the case where a change of the GT signal from the L level to the H level and the designation of the column address take place simultaneously.

As described above, the NMOS 40 is kept in conduction during the predetermined period $(t_2)$ depending on the change of the GT signal from the L level to the H level. At this time, the NMOS 42 is in the conducting state. On the other hand, the NMOS $41_i$ corresponding to the specified column address is brought into the conducting state during the predetermined period $(t_1)$ substantially simultaneously with the process of keeping the NMOS 42 in conduction, as described above. Thus, even when the change of the GT signal from the L level to the H level and the designation of the column address are substantially simultaneously made, the two NMOSs 40 and $41_i$ are simply brought into the conducting state. When the column address is specified in plural form, (number of column addresses+1) NMOSs are simply brought into the conducting state.

On the other hand, a conventional ATD circuit is activated in the following manner. When a GT signal changes from an L level to an H level, an output produced from the ATD circuit changes from an L level to an H level. The ATD circuit is activated so as to generate a one-shot pulse (→L→H level) when a column address is specified. Accordingly, a change of the GT signal from the L level to the H level and a change of the GT signal from the H level to the L level take place substantially at the same time, so that a desired one-shot pulse cannot be obtained, thus causing a malfunction.

However, the ATD circuit according to the present invention can prevent the occurrence of such a malfunction.

The ATD circuit can be modified in various ways. The one-shot pulse generator circuit may be constructed of a circuit other than that show in FIG. 2, for example. The resistor 21 of the load circuit 20 shown in FIG. 4 may be made up of a load MOS transistor. Further, the NMOSs shown in FIG. 1 may be replaced with P-type MOS transistors and the power source potential VCC may be replaced with the ground potential VSS.

Having now fully described the invention, it will be apparent to those skilled in the art that many changes and modifications can be made without departing from the spirit or scope of the invention as set forth herein.

What is claimed is:

1. An address transition detector circuit comprising:

an input terminal;

a one-shot pulse generator circuit having an input electrically connected to said input terminal;

a first switching device electrically connected between a first and second nodes and brought into a conducting state in response to a one-shot pulse output from said one-shot pulse generator circuit;

a second switching device electrically connected between a ground potential node and the second node and driven in response to a signal input to said input terminal;

a plurality of switching devices electrically parallel-connected between the first and second nodes and respectively driven in response to a plurality of address transition one-shot pulse signals; and power source potential supplying means for supplying a power source potential to the first node.

2. The ATD circuit according to claim 1, further comprising a first inverter having an input electrically connected to the first node and a second inverter electrically connected to an output of said first inverter.

3. The ATD circuit according to claim 1, wherein said one-shot pulse generator circuit has an input terminal, a two-input NAND gate having one input, which is electrically connected to said input terminal, and an odd number of inverters electrically series-connected between said input terminal and the other input of said two-input NAND gate.

4. The ATD circuit according to claim 1, wherein said power source potential supplying means has a power source potential and a resistor electrically connected to the first node.

5. A method of driving an ATD circuit, comprising the following steps:

a step for bringing a second switching device electrically connected to a ground potential and a second node into a conducting state in response to a change of an input signal from a first potential level to a second potential level;

a step for generating a first one-shot pulse;

a step for bringing a first switching device electrically connected to the second node and a first node into a conducting state in response to the first one-shot pulse and setting the potential at the first node to the ground potential during a period in which said first switching device responds to the first one-shot pulse; and a step for bringing at least one switching device electrically connected between the first and second nodes into a conducting state based on at least one second one-shot pulse responsive to an address transition after the change of the input signal from the first potential level to the second potential level and setting the first node to the ground potential during a period in which said at least one switching device responds to the second one-shot pulse.

* * * * *